United States Patent
Yilmaz et al.

(10) Patent No.: US 9,165,866 B2
(45) Date of Patent: *Oct. 20, 2015

(54) STACKED DUAL CHIP PACKAGE HAVING LEVELING PROJECTIONS

(71) Applicant: Alpha and Omega Semiconductor Incorporated, Sunnyvale, CA (US)

(72) Inventors: Hamza Yilmaz, Saratoga, CA (US); Xiaotian Zhang, San Jose, CA (US); Yan Xun Xue, Los Gatos, CA (US); Anup Bhalla, Santa Clara, CA (US); Jun Lu, San Jose, CA (US); Kai Liu, Mountain View, CA (US); Yueh-Se Ho, Sunnyvale, CA (US); John Amato, Tracy, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/071,626

(22) Filed: Nov. 4, 2013

(65) Prior Publication Data

US 2014/0054758 A1    Feb. 27, 2014

Related U.S. Application Data

(63) Continuation of application No. 12/819,111, filed on Jun. 18, 2010, now Pat. No. 8,581,376.

(51) Int. Cl.
*H01L 23/495* (2006.01)
*H01L 23/02* (2006.01)
*H01L 23/00* (2006.01)
*H01L 23/31* (2006.01)

(52) U.S. Cl.
CPC .... *H01L 23/49541* (2013.01); *H01L 23/49524* (2013.01); *H01L 23/49537* (2013.01); *H01L 23/49562* (2013.01); *H01L 23/49575* (2013.01); *H01L 24/37* (2013.01); *H01L 24/40* (2013.01); *H01L 24/41* (2013.01); *H01L 24/81* (2013.01); *H01L 24/84* (2013.01); *H01L 23/3107* (2013.01); *H01L 24/48* (2013.01); *H01L 2224/27013* (2013.01); *H01L 2224/2929* (2013.01); *H01L 2224/29101* (2013.01); *H01L 2224/32245* (2013.01); *H01L 2224/37011* (2013.01); *H01L 2224/40247* (2013.01); *H01L 2224/48247* (2013.01); *H01L 2224/92* (2013.01); *H01L 2924/014* (2013.01); *H01L 2924/01006* (2013.01); *H01L 2924/01013* (2013.01); *H01L 2924/01029* (2013.01); *H01L 2924/01033* (2013.01); *H01L 2924/01067* (2013.01); *H01L 2924/01079* (2013.01); *H01L 2924/01082* (2013.01); *H01L 2924/1306* (2013.01); *H01L 2924/13091* (2013.01); *H01L 2924/14* (2013.01)

(58) Field of Classification Search
CPC ............... H01L 23/49541; H01L 23/49537; H01L 23/49562; H01L 23/49575; H01L 23/49524
USPC ......... 257/666, 672, 675, 676, 685, 686, 692, 257/693, 698, 723, 724, 734, 777, E23.042, 257/E23.043, E23.046, E23.052, E23.061
See application file for complete search history.

(56) References Cited

U.S. PATENT DOCUMENTS

| | | | | |
|---|---|---|---|---|
| 5,714,405 | A * | 2/1998 | Tsubosaki et al. | 438/118 |
| 6,080,264 | A * | 6/2000 | Ball | 156/292 |
| 8,581,376 | B2 * | 11/2013 | Yilmaz et al. | 257/676 |

*Primary Examiner* — Hung Vu
(74) *Attorney, Agent, or Firm* — Kenneth C. Brooks

(57) ABSTRACT

The present invention is directed to a lead-frame having a stack of semiconductor dies with interposed metalized clip structure. Level projections extend from the clip structure to ensure that the clip structure remains level during fabrication.

16 Claims, 17 Drawing Sheets

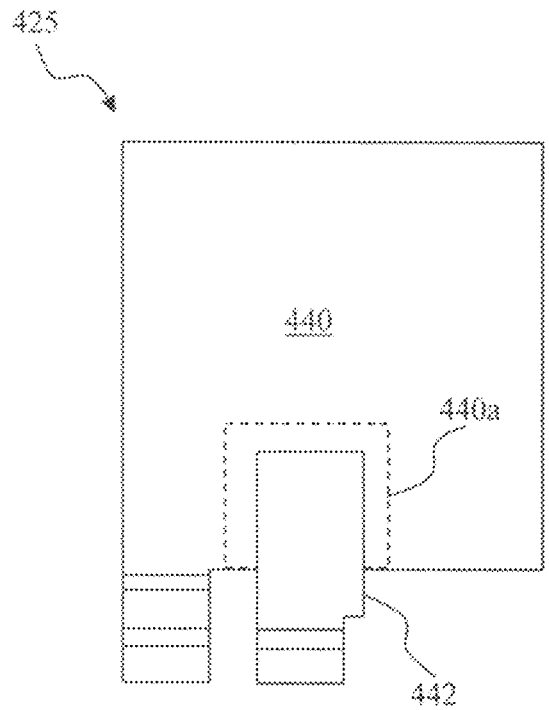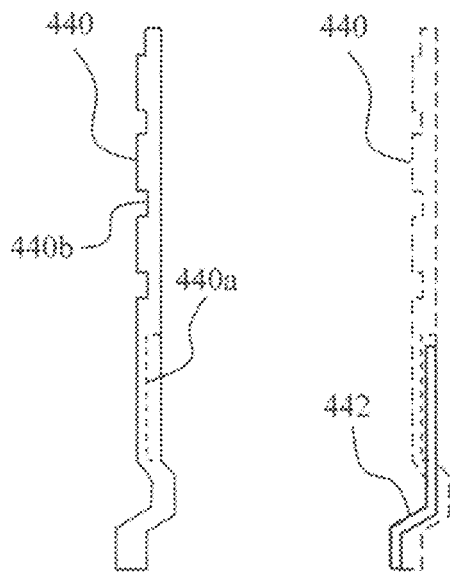
Fig. 18A　　　　Fig. 18B　　　　Fig. 18C
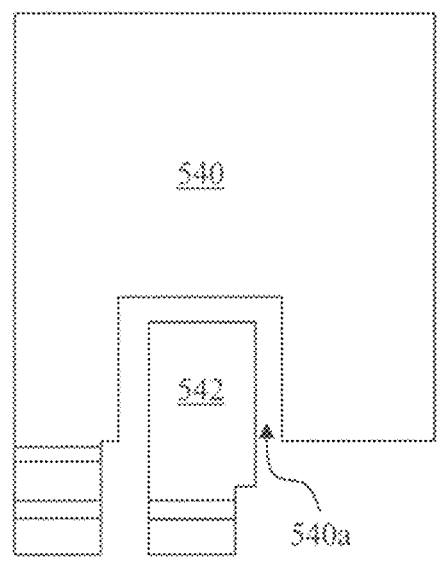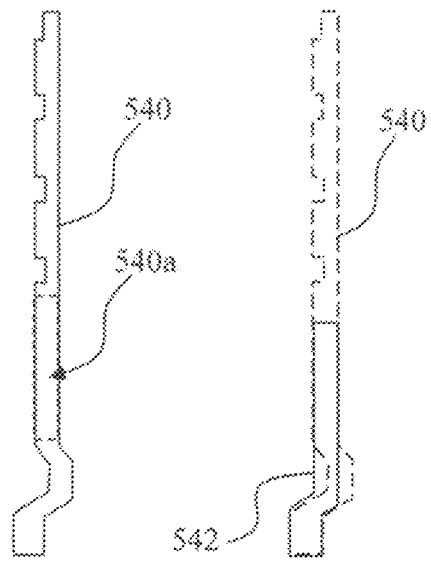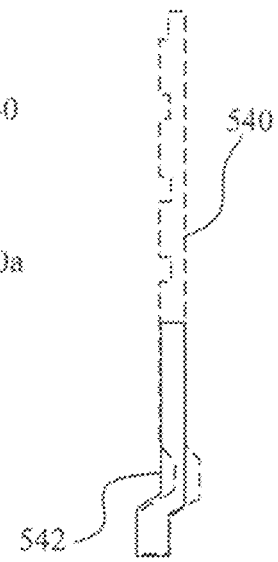
Fig. 19A　　　　Fig. 19B　　　　Fig. 19C

STACKED DUAL CHIP PACKAGE HAVING LEVELING PROJECTIONS

CROSS-REFERENCE TO RELATED PATENT APPLICATIONS

This patent application is a Continuation Application of U.S. patent application Ser. No. 12/819,111 filed Jun. 18, 2010 entitled STACKED DUAL CHIP PACKAGE AND METHOD OF FABRICATION and having Hamza Yilmaz, Xiaotian Zhang, Yarn Xun Xue, Anup Bhalla, Jun Lu, Kai Liu, Yueh-Se Ho and John Amato listed as inventors, which is a Continuation-in-part of U.S. application Ser. No. 12/726,892 filed Mar. 18, 2010 having Jun Lu, Ming Sun, Yueh-Se Ho, Kai Liu and Lei Shi listed as inventors. This application is incorporated by reference herein.

BACKGROUND OF THE INVENTION

The present invention generally relates to semiconductor packages and more particularly to multi-semiconductor chip packages and methods of fabrication.

In DC to DC converters, multiple field effect transistors, FETs are often electrically connected in a common package. One DC-DC converter includes a high-side (HS) FET and a low-side (LS) FET. Typically, the HS FET and LS FET are mounted side-by-side and are electrically connected employing wires. This provides a DC to DC converter with a foot print that is larger than otherwise desired.

A need exists, therefore, to form DC to DC converter packages with a size that is smaller than currently exists.

SUMMARY OF THE INVENTION

The present invention features lead frame package having a first semiconductor die, a clip structure attached to the first semiconductor die; and a plurality of leveling projections located between the clip structure and the first semiconductor die, such that the clip structure is parallel with the semiconductor die, wherein an adhesive material is located between at least some of the leveling projections, attaching the clip structure to the first semiconductor die. These and other aspects of the invention are discussed more fully below.

BRIEF DESCRIPTION OF THE DRAWINGS

FIGS. 17A through 17I-3 are top and cross sectional views showing a method of assembling a stacked die structure according to an alternative embodiment of this invention.

FIGS. 18A through 18C are top and cross sectional views of a stacked die structure according to another alternative embodiment of this invention.

FIGS. 19A through 19C are top and cross sectional views of a stacked die structure according to another alternative embodiment of this invention.

DETAILED DESCRIPTION OF THE INVENTION

Figure 1:
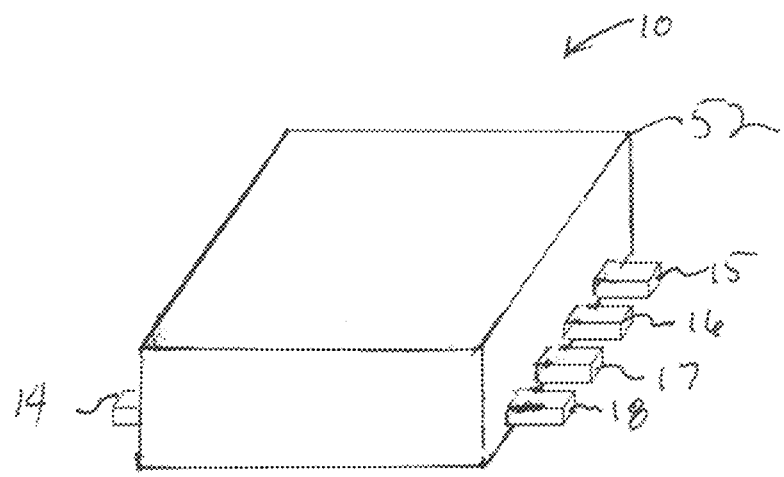
FIG. 1 is a perspective view of a lead frame package in accordance with a first embodiment of the present invention.
Figure 2:
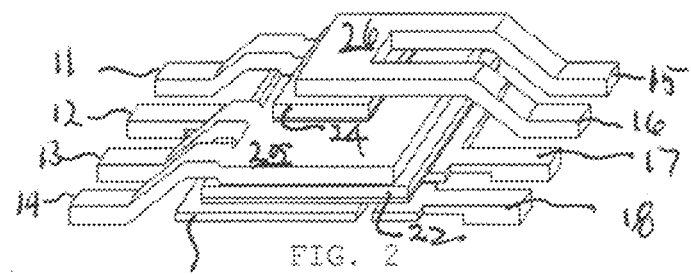
FIG. 2 is a perspective view of the lead frame package shown in FIG. 1 with encapsulating molding material removed.

Referring to both FIGS. 1 and 2, a lead frame package 10 includes a plurality of leads 11-18, base lead frame 20, first and second semiconductor dies 22 and 24 and first and second Clip structures 25 and 26. First clip structure 25 is positioned between first and second semiconductor dies 22 and 24. First semiconductor die 22 is positioned between base lead frame 20 and first clip structure 25. Second semiconductor die 24 is positioned between first and second clip structures 25 and 26. Semiconductor dies 22 and 24 may be any known in the electrical art. In the present example semiconductor dies 22 and 24 are transistors such as a power Field Effect Transistor (FET) or a power metal oxide semiconductor FET (MOSFET).

Figure 3:
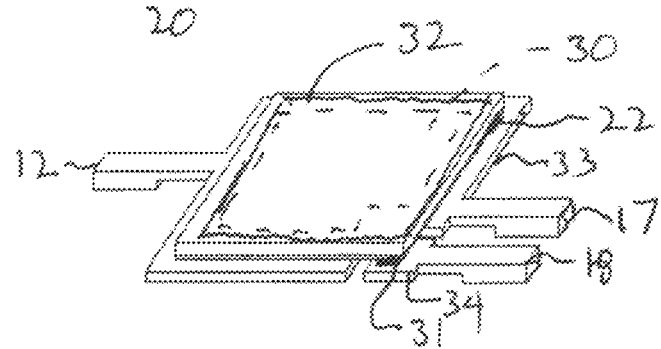
FIG. 3 is a perspective view of a base lead frame and semiconductor the attached thereto that are shown in FIG. 2, with the other components of FIG. 2 being omitted.

Referring to both FIGS. 2 and 3, semiconductor die 22 has a source contact 30, a gate contact 31 and a drain contact 32. Source contact 30 and gate contact 31 are on a common side of semiconductor die 22 disposed opposite to drain contact 32. As a result, source contact 30 is shown in dashed lines. Specifically, source and gate contacts 30 and 31 face base lead frame 20 and are in electrical communication therewith. First semiconductor die 22 has an area that is in superimposition with first clip structure 25.

Base lead frame 20 includes first and second 33 and 34 electrically conductive segments, which may be formed from any suitable conductive material, such as gold, copper and aluminum or an alloy thereof. First segment 33 is electrically isolated from second segment 34. The relative dimensions of first and second segments 33 and 34 are established to satisfy the operational and electrical requirements of first semiconductor die 22. To that end, first segment 33 is in superimposition and connected with source contacts 30, and second segment 34 is in superimposition and connected with gate contact 31 of the first semiconductor die 22. Since the source and gate contacts are typically found on the front side of a vertical MOSFET die, the first semiconductor die 22 can be said to be flip chip mounted on the base lead frame, with the drain contact 32 sticking up.

Figure 4:
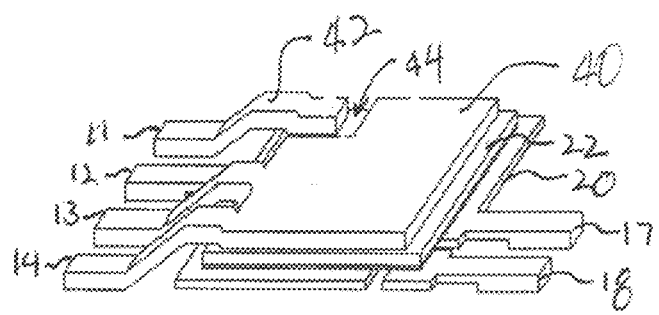
FIG. 4 is a perspective view of a first clip structure mounted to the structure shown in FIG. 3.

Referring to FIGS. 2, 3 and 4, a clip structure 25 is attached to drain contact 32 of first semiconductor die 22. Specifically, clip structure 25 includes multiple spaced-apart conductive segments 40 and 42. Conductive segment 40 is electrically isolated from segment 42 using any technique known. As shown, a void 44 is present between conductive segments 40 and 42. Conductive segment 40 is in electrical communication with drain contact 32 and may be attached thereto using any known technique, e.g., conductive epoxy. Conductive segment 42 may be attached to semiconductor die 22 non-conductively, e.g. with non-conductive epoxy, so as to be isolated from drain contact 32.

Figure 5:
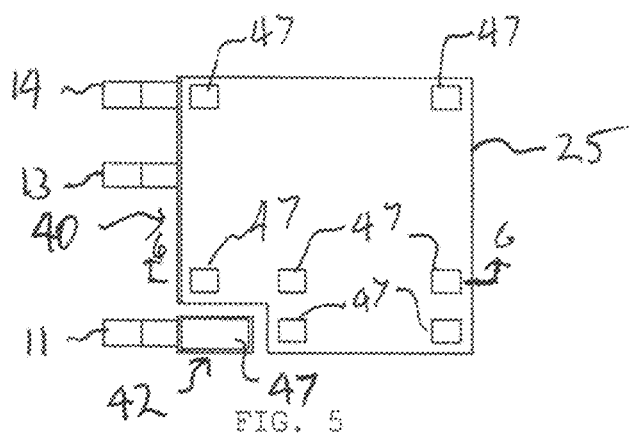
FIG. 5 is bottom-up view of the clip structure shown in FIG. 4.
Figure 6:
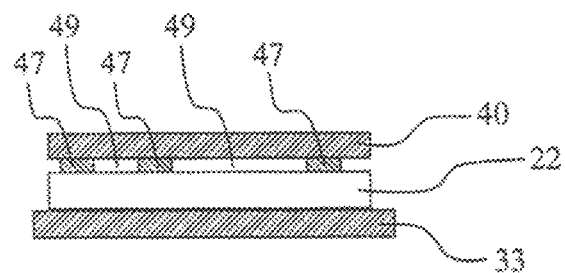
FIG. 6 is a partial cross sectional view of the clip structure shown in FIG. 5, taken along lines 6-6.

Referring to both 5 and 6, extending from a side of first clip structure 25 facing first semiconductor die 22 are one or more electrically insulative projections 47 which may be formed from silicone. The projections are attached to the clip structure 25 using a known technique before attaching clip structure 25 to first semiconductor die 22 in one example, projections 47 are arranged to extend from segments 40 and 42 toward first semiconductor die 22 and being attached thereto using any suitable adhesive. As a result, a hiatus 49 is present between first semiconductor die 22 and first clip structure 25 as can be seen in the cross section of FIG. 6, taken along lines 6-6 of FIG. 5. Conductive adhesive, such as solder or conductive epoxy may be used to fill in the hiatus 49 and electrically connect segment 40 to first semiconductor die 22. Projections 47 are included to ensure that first clip structure 25 is substantially level during fabrication of package 10. As a result, all projections 47 may have a common height. Alternatively, the height of projections may be tailored to compensate for non-homogeneities of the thickness or contours of first clip structure 25 so as to maintain a substantially level surface upon which to mount second semiconductor die 24. The projections 47 also help to keep insulate the segment 42 from first semiconductor die 22.

Figure 7:
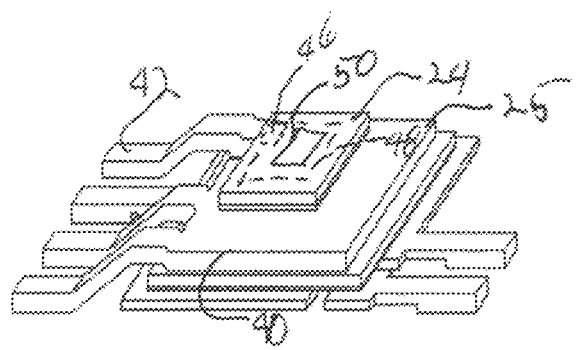
FIG. 7 is a perspective view showing a second semiconductor die mounted to the first clip structure shown in FIG. 4.

Referring to both FIGS. 4 and 7, attached upon clip structure 25 is second semiconductor die 24. Semiconductor die 24 includes gate, source and drain contacts 46, 48 and 50. Although drain contact 50 is shown as being a su-portion of the backside of semiconductor die 24 in practice the drain contact may comprise the entire backside. Gate contact 46 faces, and is in superimposition with, conductive segment 42 being in electrical communication therewith using, e.g., conductive epoxy or solder. Source contact 48 faces conductive segment 40 and is in electrical communication therewith using, e.g., conductive epoxy or solder. Drain contact 50 is disposed on a side of semiconductor die 24 facing away from clip structure 25. Since the gate and source contacts 46, 48 are facing down, second semiconductor die 24 can be said to be mounted flip chip on first clip structure 25. Note that the projections 47 allow the segment 42 of first clip structure 25 be located over first semiconductor die 22 while being electrically isolated from it—thus the gate contact 46 of second semiconductor die 24 can be electrically connected to conductive segment 42 without being electrically connected to the first semiconductor die 22. In addition the projections 47 ensure that the second semiconductor die 24 has an even surface on segments 40 and 42 to which to be mounted.

Figure 8:
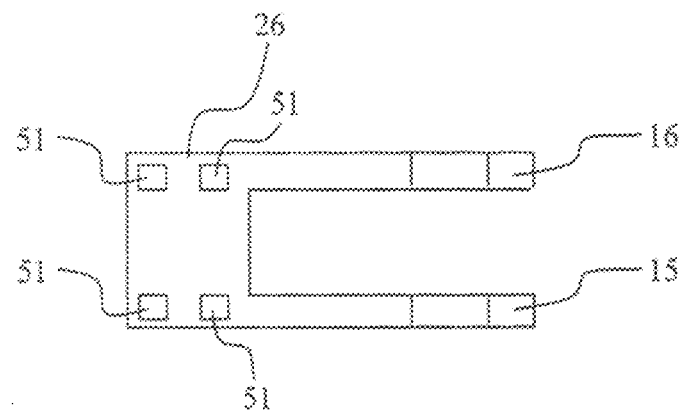
FIG. 8 is bottom-up view of the clip structure shown in FIG. 2.

Referring to FIGS. 2, 7 and 8 second clip structure 26 is attached to drain contact 50 e.g., using conductive epoxy or solder. Second clip structure 26 may also include a plurality of leveling projections 51, shown in FIG. 8, extending toward second semiconductor die 24 in a manner discussed above with respect to first clip structure 25, shown in FIGS. 5 and 6. These projections may help keep the second clip structure 26 level throughout the assembly process and can be conductive or non-conductive. A conductive adhesive (e.g. conductive epoxy or solder) may be used to attach and electrically connect second clip structure 26 to the second semiconductor die 24. This stack may then be wholly or partially encapsulated using any suitable molding compound 52, shown FIG. 1. As shown molding compound 52 completely encapsulates semiconductor dies 22 and 24, with parts of leads 11-18 being exposed.

As shown each of leads 11-18 are integrally formed with one of base lead frame 20, first dip structure 25 or second dip structure 26. As shown, leads 12, 17 and 18 are integrally formed with base lead frame 20 and leads 11, 13 and 14 are integrally formed with first clip structure 25. Leads 15 and 16 are integrally formed with second clip structure 26. As a result, leads 12 and 17 function as a pin out of lead frame package 10 for source contact 30 of first semiconductor die 22. Lead 18 function as the pin outs for gate contact 31, respectively, of first semiconductor die 22. Lead 11 functions as the pin outs for gate contact 46 of second semiconductor die 24, and leads 13 and 14 function as the pin outs for both source contact 48 of second semiconductor die 24 and drain contact 32 of first semiconductor die 22. Leads 15 and 16 function as pin outs for drain contact 50 of second semiconductor die 24.

Figure 9:
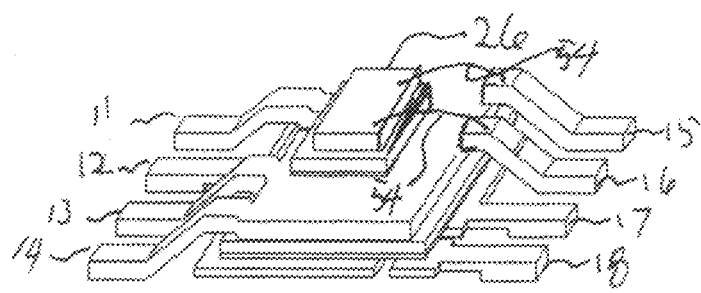
FIG. 9 is a perspective view of the lead frame package shown in FIG. 2 in accordance with a first alternate embodiment.

Although the leads 11-18 are shown as being integral with one of base lead frame 20, first clip structure 25 or second clip structure 26, this is not necessary. For example, any one of leads 11-18 may be placed in electrical contact with one of base lead frame 20, first clip structure 25 or second clip structure 26 using any known techniques, such as use of a wire bond or conductive ribbon 54, shown in FIG. 9, which is associated with wire bonding or ribbon bonding techniques. In these cases, the second clip structure 26 is not necessary and the drain contact 50 of second semiconductor die 24 may be bonded directly to leads 15 and 16 using either wire bonding or ribbon bonding techniques. Also, instead of the leads being integrally formed with the first and second clip structures, the first and second dip structures can alternatively make contact to leads of a base lead frame.

Figure 10A:
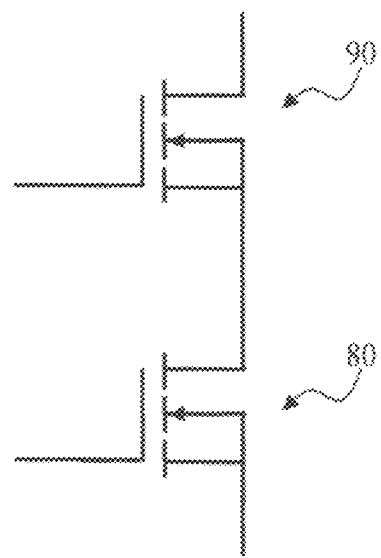
FIGS. 10A and 10B are circuit schematics showing two common half bridge circuits.

FIG. 10A shows a half bridge circuit of two transistors in series. More specifically, FIG. 10A shows two n-channel MOSFETs in series, with the drain of low side MOSFET 80 connected to the source of high side MOSFET 90. This circuit configuration is particularly useful in power conversion systems. Typically, the low side MOSFET 80 handles more current than the high side MOSFET 90. Thus it typically requires a larger die size than the high side MOSFET 90. In addition, a typical vertical MOSFET is constructed with the source and gate contacts on the top side, and the drain contact on the bottom side. Taken together, this presents a problem for stacking MOSFETs for a half bridge circuit. For geometric, and stability reasons, the larger die, e.g., the low side MOSFET, should go on the bottom. Thus first semiconductor die (of FIG. 2) is the low side MOSFET 80, and second semiconductor die 24 is the high side MOSFET 90. However, to effect the necessary connections of the drain of low side to source of high side, both MOSFETs must be mounted flip chip style. However, now it is difficult to make a connection to the gate of the high side MOSFET, since the gate contact is facing down toward the low side MOSFET. This invention solves this by using a non-conductive projection 47 on the bottom of the conductive segment 42 of first clip structure 25. This way, a connection can be made to gate contact 46 of second semiconductor die 24, without shorting it the first semiconductor die 22.

Figure 10B:
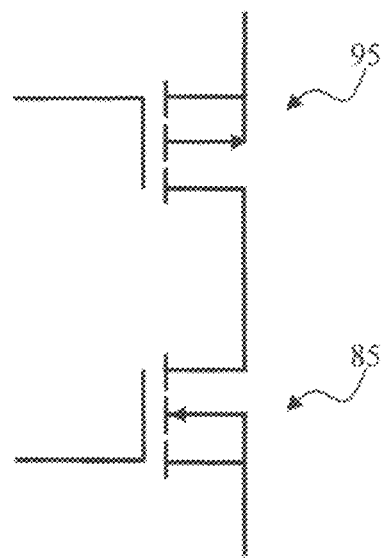

In an alternative circuit shown in FIG. 10B, two MOSFETs are attached in series, however in this case, the low side MOSFET 85 is an n-channel MOSFET, while the high side MOSFET 95 is a p-channel MOSFET. In this configuration the drain of the high side MOSFET 95 is connected to the drain of the low side MOSFET 85, which allows a simpler stacking configuration as will be illustrated in FIGS. 11 to 14.

Figure 11:
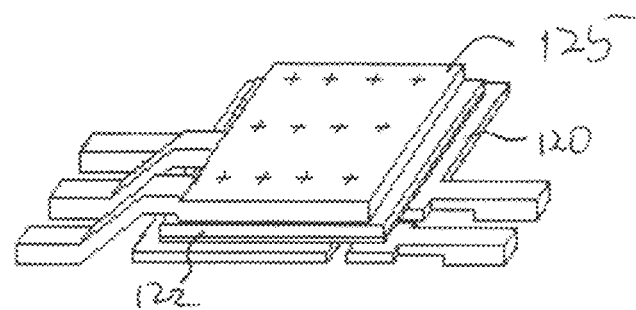
FIG. 11 is a perspective view of a lead frame package similar to that shown in FIG. 4, in accordance with a second embodiment of the present invention.
Figure 12:
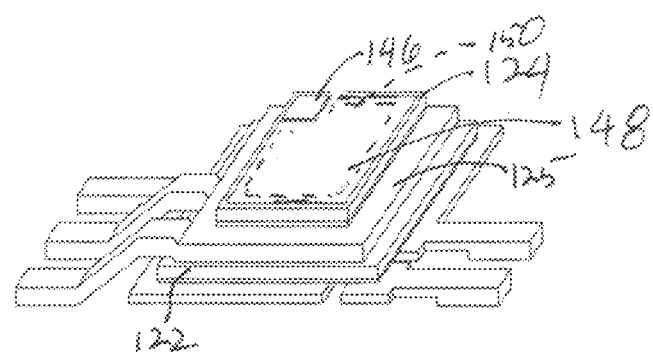
FIG. 12 is a perspective view of the lead frame package shown in FIG. 11 with a second semiconductor die mounted thereto.
Figure 13:
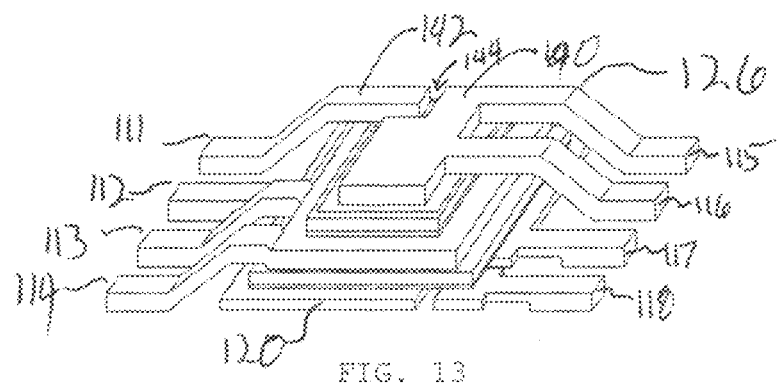
FIG. 13 is a perspective view of a second clip structure mounted to the lead frame package shown in FIG. 12.
Figure 14:
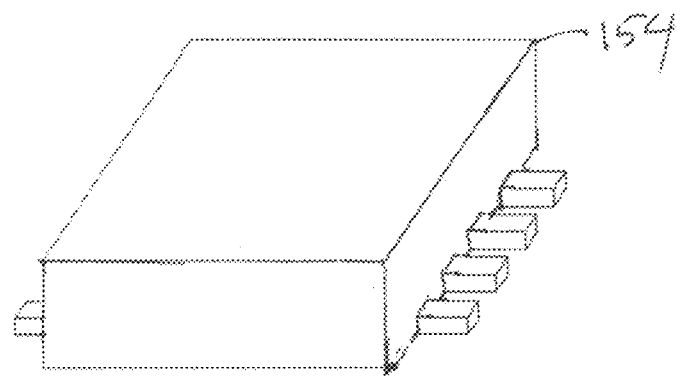
FIG. 14 is a perspective view shown the lead frame package of FIG. 13 with encapsulating molding compound.

Referring to FIGS. 11 and 12, in accordance with another embodiment and the circuit of FIG. 10B, a first semiconductor die 122 is flip chip mounted on a base lead frame 120, similarly to FIG. 3. A first clip structure 125 is attached to the drain of the first semiconductor die 122; however in this case the first clip structure 125 consists of only one conductive segment. The second semiconductor die 124 is mounted so that gate contact 146 and source contact 148 faces away from first semiconductor die 122. Drain contact 150 of second semiconductor die 124 faces first clip structure 125. Unlike first clip structure 25, first clip structure 125 is of unitary construction in that is comprised of a single conductive element, with drain contacts 150 of second semiconductor die 124 and drain contact of first semiconductor die 122 being in electrical communication therewith.

Gate and source contacts 146 and 148 are placed in electrical communication with a second clip structure 126. Similar to first clip structure 25, second clip structure 126 includes multiple spaced-apart conductive segments 140 and 142. Conductive segment 140 is in electrical communication with source contact 148 and is electrically isolated from segment 142 using any technique known. As shown, a void 144 is present between conductive segments 140 and 142. Conductive segment 140 is in electrical communication with gate contact 146 and may be attached thereto using any known technique, e.g., conductive epoxy. This stack may then be partially or wholly encapsulated in a molding compound 152, shown in FIG. 14.

As shown, leads 112, 117 and 118 are integrally formed with base lead frame 120, and leads 113 and 114 are integrally formed with first clip structure 125. Leads 111, 115 and 116 are integrally formed with second clip structure 126. As a result, leads 112 and 117 function as pin outs of lead frame package 110 for the source contact of first semiconductor die 122. Lead 118 functions as the pin out for the gate contact of first semiconductor die 122. Leads 113 and 114 functions as the pin outs for both drain contacts 150 of second semiconductor die 124 and the drain contacts of first semiconductor die 122. Leads 115 and 116 function as pin outs for source contact 148 of second semiconductor die 124, and lead 111 functions as the pin outs for gate contact 146 of the same. In this case, the first semiconductor die 122 is the low side n-channel MOSFET 85 (of FIG. 10B), and second semiconductor die 124 is the high side p-channel MOSFET 95.

Although the leads 111-118 are shown being integral with one of base lead frame 120, first clip structure 125 or second clip structure 126, this is not necessary. For example, any one of leads 111-118 may be integrally formed on a segment of base lead frame, with the first clip structure 125 or second clip structure 126 making contact to it using any known techniques, as discussed above. Also, the second clip structure could be replaced with bond wires or conductive ribbons, as discussed above.

Figure 15A:
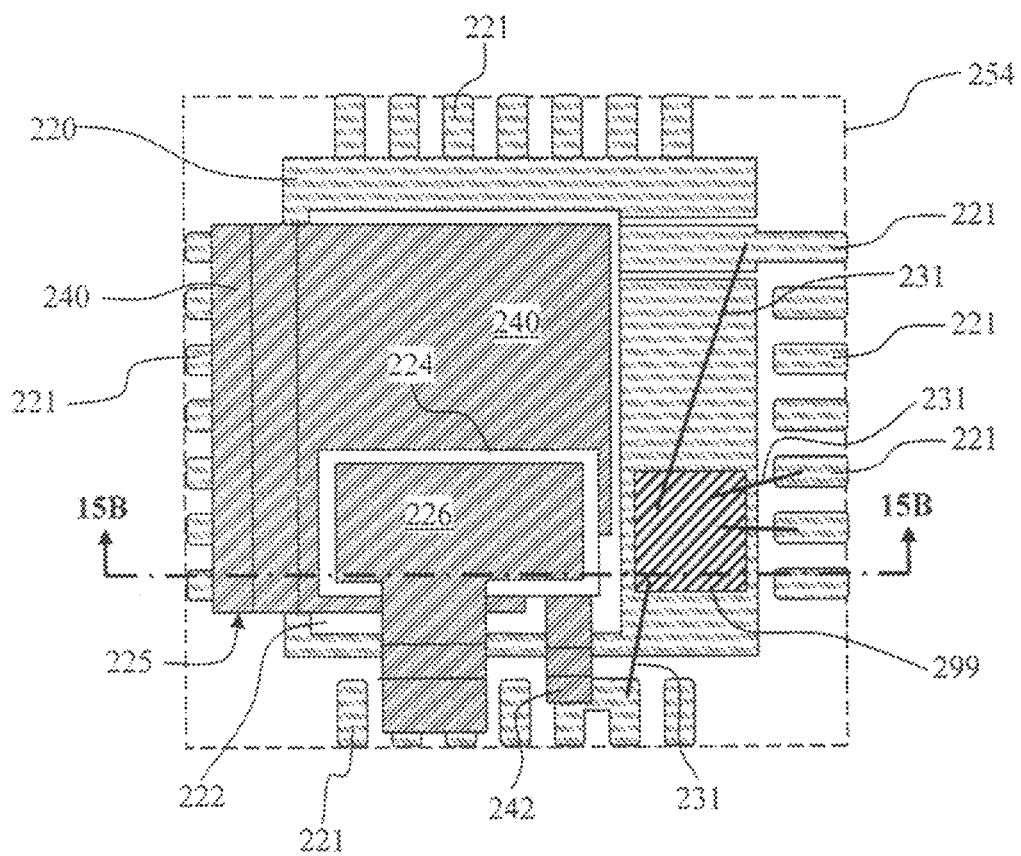
FIGS. 15A and 15B are a top view and a cross sectional view, respectively, of a stacked die structure of this invention co-packaged with an IC control chip.
Figure 15B:
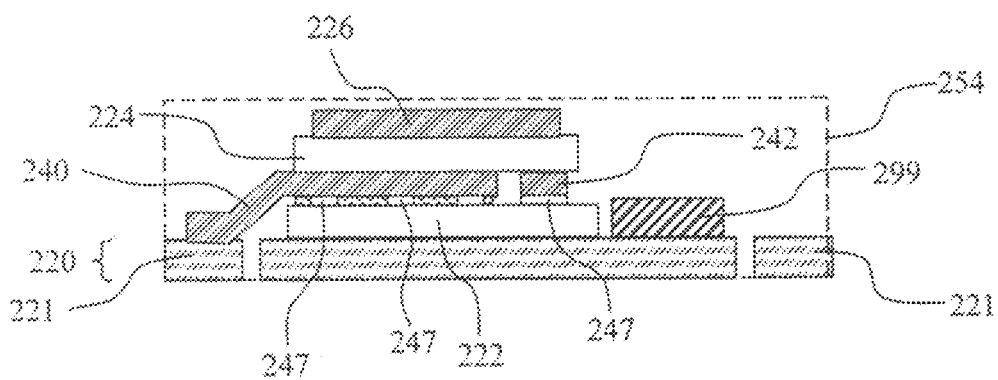

The die stack structures like those shown above can also be co-packaged with a control integrated circuit (IC) chip to form an integrated power IC package as shown in FIGS. 15A and 15B. FIG. 15B is taken along a cross section line 15B of FIG. 15A. A base lead frame 220, e.g. for a 5×5 QFN (quad flat non-leaded) package, for this package may include a plurality of leads 221. In this case, the base lead frame 220 may have leads 221 extending both ways in two orthogonal directions. A first semiconductor die 222 may be flip chip mounted on the base lead frame 220 as described above. A first clip structure 225, comprising conductive segments 240 and 242 may be attached over the first semiconductor die 222. Non conductive projections 247 may be first formed on the bottom of first clip structure 225 to ensure even placement, and to keep segment 242 from being electrically connected to first semiconductor die 222, as described above. Conductive adhesive between projections 247 may conductively attach the segment 240 to the first semiconductor die. A second semiconductor die 224 can be mounted on segments 240 and 242 of the first clip structure. A second clip structure 226 may be placed over the second semiconductor die 224. As shown in the figure, the first and second clip structures 225 and 226 do not have leads integrally formed within themselves, but instead are connected to other structures on which the leads 221 are formed. A controller IC chip 299 is co-packaged on the base lead frame 220 next to the stacked semiconductor dies 222 and 224. The controller IC chip 299 may by non-conductively mounted on base lead frame 220, e.g. by non-conductive epoxy. Thus an integrated power IC package may be formed. The outline of the chip package is shown by dashed line 254. Bond wires 231 may connect the IC chip 299 to various leads 221 and to the gates of semiconductor dies 222 and 224 through leads 221, to effect control of the semiconductor dies. For example, the IC chip 299 may be a power IC control chip, and the first and second semiconductor dies 222 and 224 may be low side and high side field effect transistors (FETs), respectively, to form an integrated power IC package.

Figure 16A:
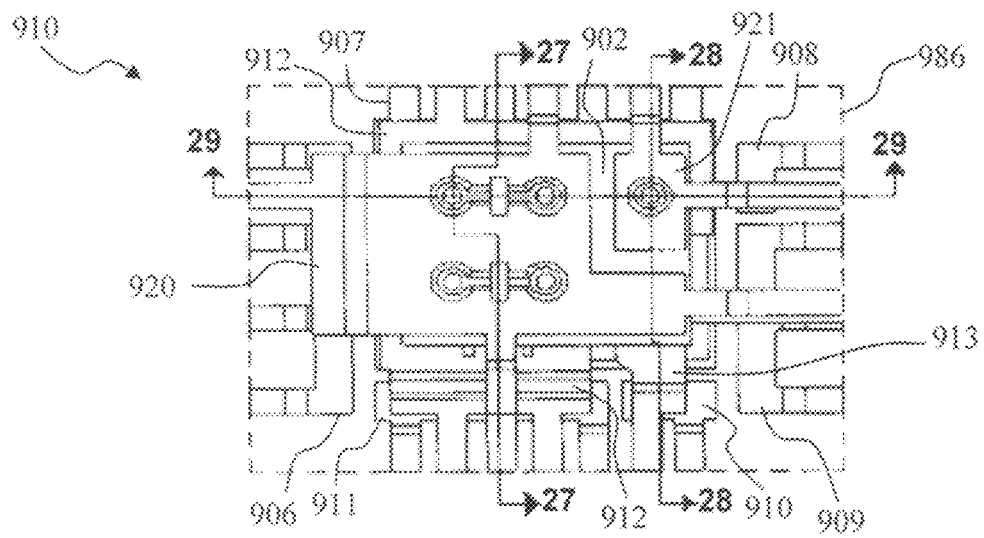
FIGS. 16A and 16B are top and cross sectional views, respectively, based on figures from U.S. application Ser. No. 12/726,892.
Figure 16B:
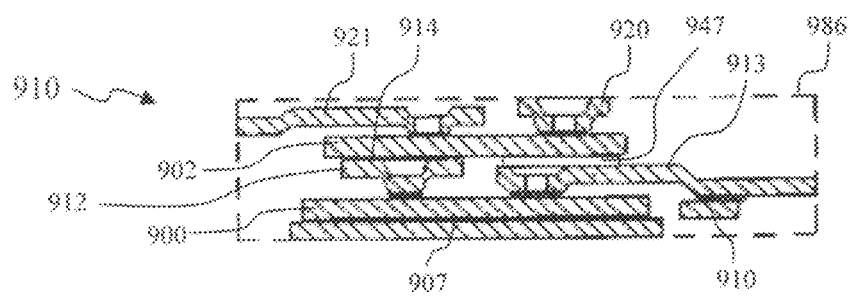

These non-conductive projections can also be used in an extension to U.S. application Ser. No. 12/726,892 filed Mar. 18, 2010. In FIGS. 16A and 16B, which are adapted from FIGS. 26 and 28 of U.S. application Ser. No. 12/726,892, a stacked die semiconductor package 910 is shown. FIG. 16B is taken along cross section 28-28 of FIG. 16A. A base lead frame including conductive segments 906, 907, 908, 909, 910, and 911, is found at the bottom. A first semiconductor die 900 is mounted on the segment 907 of the base lead frame. As shown here, the semiconductor is mounted device side up, i.e. not flip chip mounted. A first clip structure including conductive segments 912 and 913 are placed on the first semiconductor die 900. A second semiconductor die 902 may be placed over the first clip structure segments 912 and 913. A single non-conductive projection 947 may be placed over the clip structure segment 913 to prevent electrical connection to the second semiconductor die 902. Second semiconductor die 902 is also mounted device side up. Finally, the second clip structure including conductive segments 920 and 921 may be placed on the second semiconductor die 902. The package 910 may be encased in molding compound 986.

In this case the first semiconductor die 900 is the high side MOSFET 80 (FIG. 10A), and the second semiconductor die 902 is the low side MOSFET 90 and have source and gate contacts (not shown) facing up and drain contact (not shown) facing down. In this case, the low side MOSFET die 902 is stacked over the high side MOSFET die 900, but can at least be made as large as the high side MOSFET die 900. The low side MOSFET die 902 can overlap the gate contact (not shown) portion of the high side MOSFET die 900 because the high side gate clip 913 is not electrically connected to the low side MOSFET die 902. The non-conductive projection 947 can help ensure that no electrical connection is made between the two and keep the second semiconductor die 902 level and secure when mounted on the first clip structure segments 912 and 913.

Figure 17A:
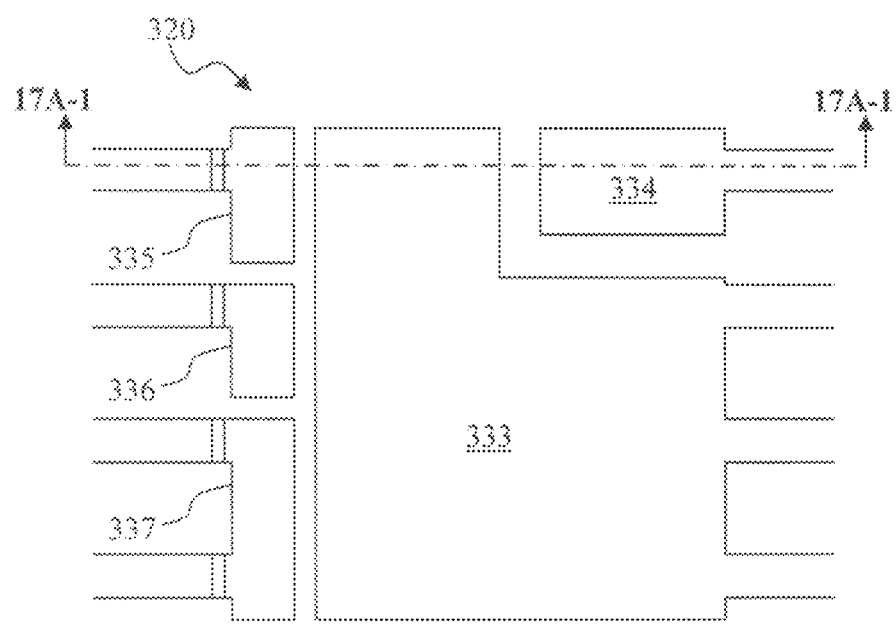
Figures 1, 17A:
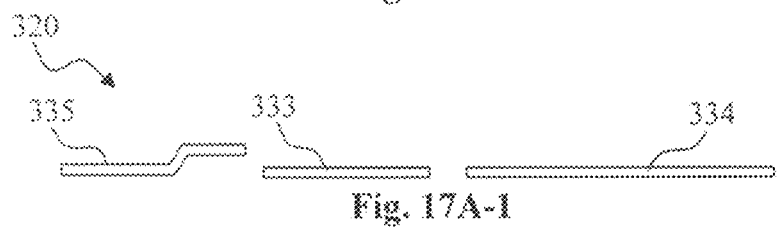
Figure 17B:
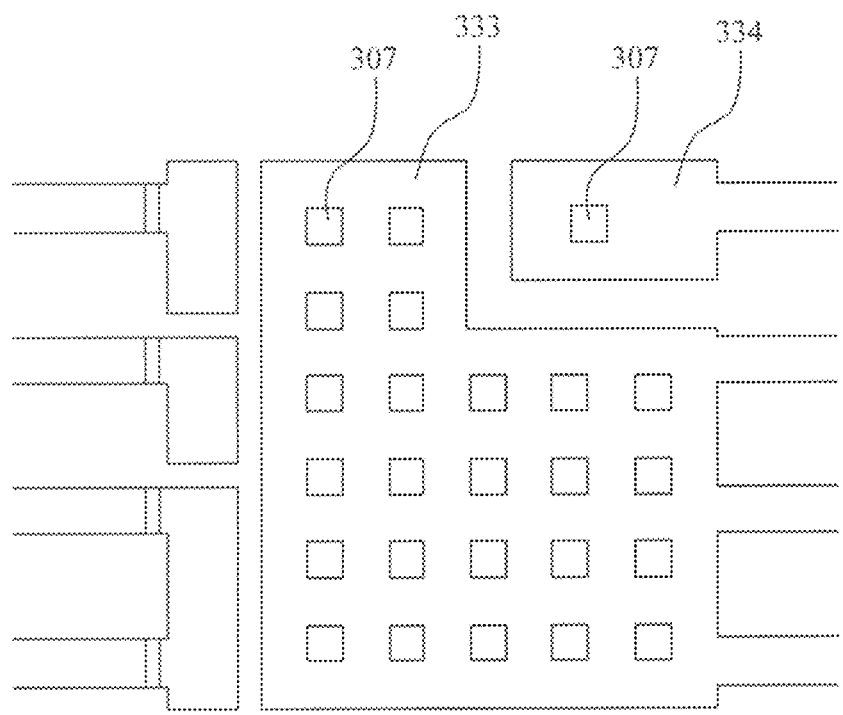
Figure 17A:
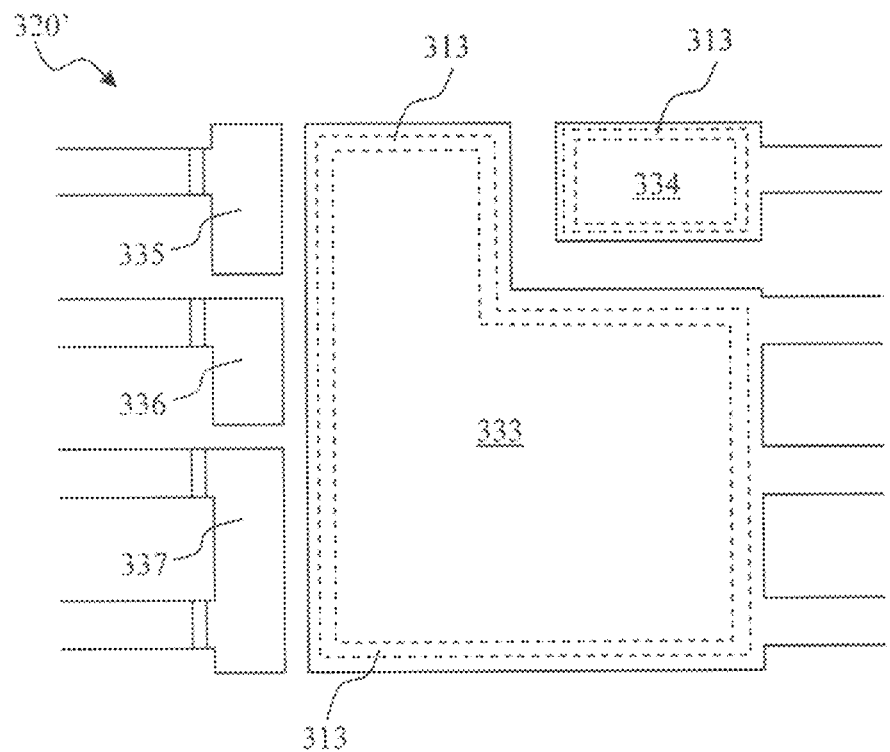
Figure 17A:
Figure 17C:
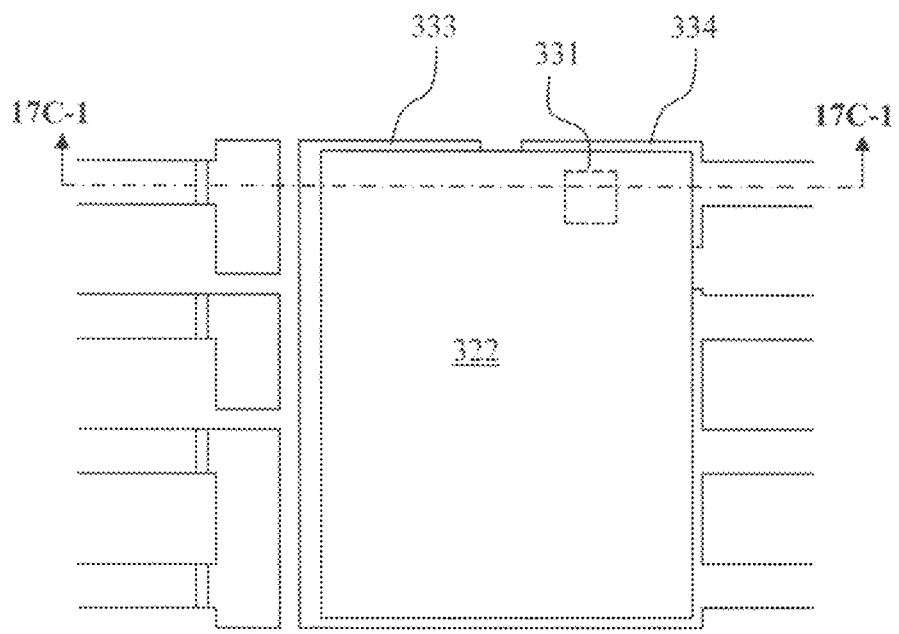
Figures 1, 17C:
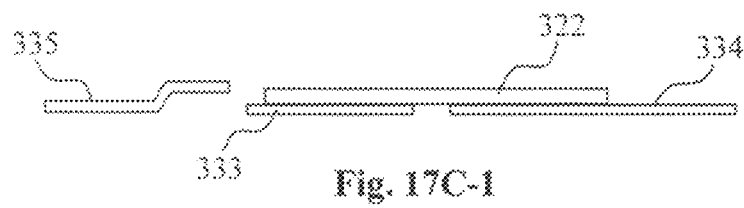

The stacked die structure can also be realized in an alternative configuration where the first clip structure comprises two overlapping segments. Referring to FIGS. 17A-17C, a first semiconductor die 322 is flip chip mounted on a base lead frame 320 including conductive segments 333, 334, in a manner similar to that described above. FIG. 17A shows a top view of the base lead frame 320. The base lead frame 320 may also include conductive lead segments 335, 330 and 337. In the cross sectional view of FIG. 17A-1 which is taken along line 17A-1 of FIG. 17A, the lead segments (e.g. 335) are shown to have raised ends. By way of example, a conductive adhesive 307 may first be applied onto the conductive segments 333 and 334 (FIG. 17B) before attaching first semiconductor die 322. Optionally, as shown in FIG. 17A', the base lead frame 320' may include a groove 313 on its top surface that runs near its edge. The groove 313 can be used to contain the conductive adhesive, e.g. solder, during the attachment process. FIG. 17A'-1 shows a cross sectional view of a groove 313. Semiconductor die 322 is conductively attached to base lead frame segments 333 and 334. The gate contact 331 of die 322 is facing down, but its relative location is indicated by dashed lines in FIG. 17C. The gate contact 331 contacts the conductive segment 334, while the source contact (not shown) contacts the conductive segment 333 of base lead frame 320. FIG. 17C-1 is a cross sectional view of FIG. 17C along line 17C-1 and shows the semiconductor die 322 mounted atop base lead frame segments 333 and 334. By way of example, the top of the raised portion of lead frame segment 335 may be co-planar with the top of semiconductor die 322.

Figure 17D:
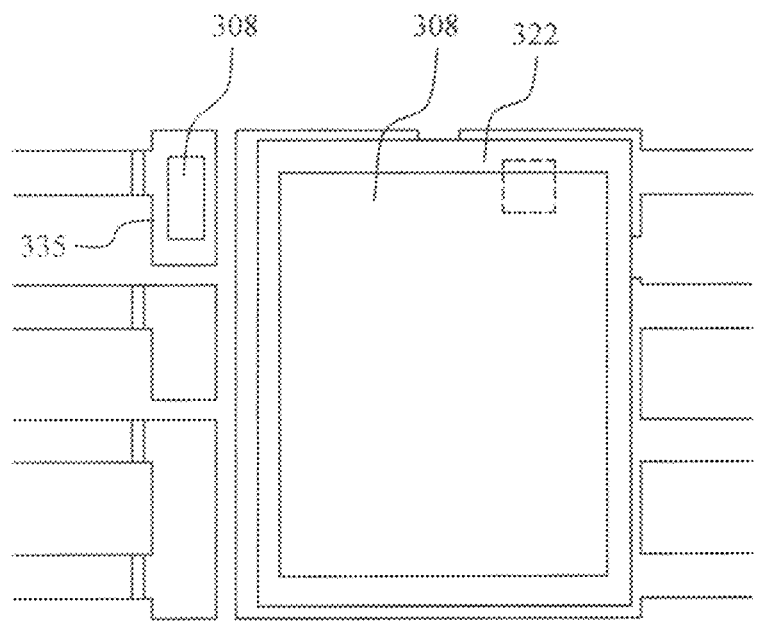
Figure 17E:
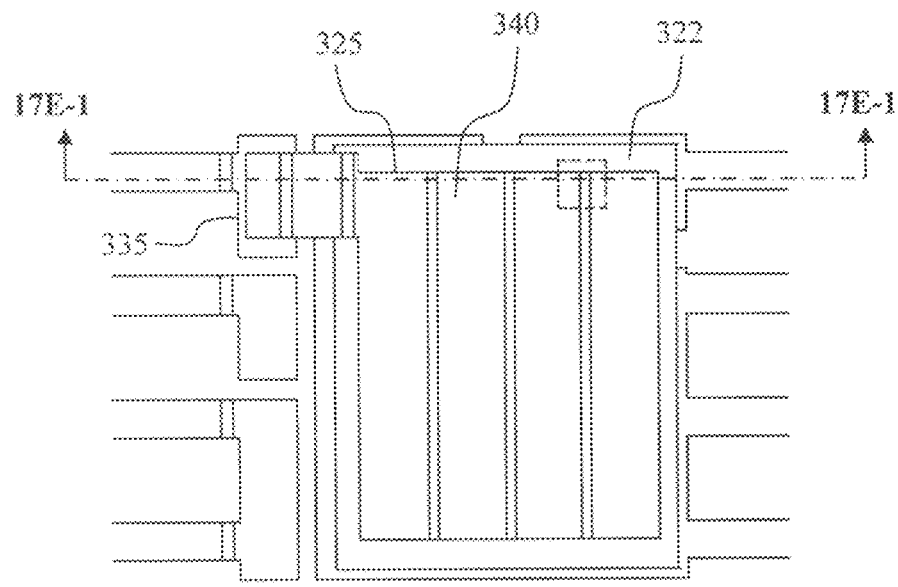
Figures 1, 17E:
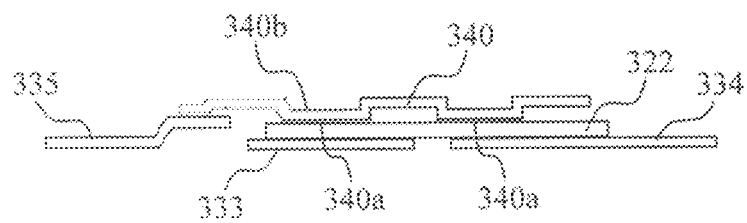
Figures 2, 17E:
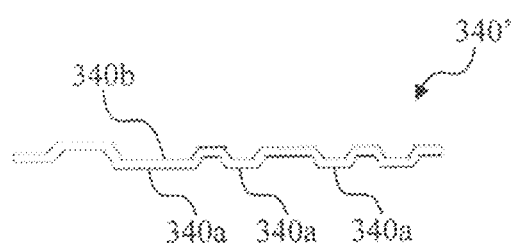
Figures 3, 17E:
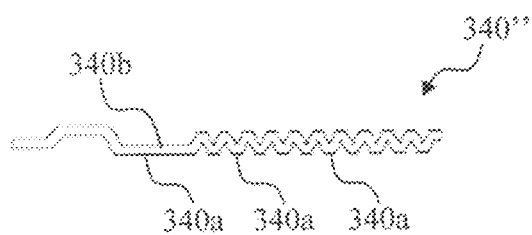
Figure 17F:
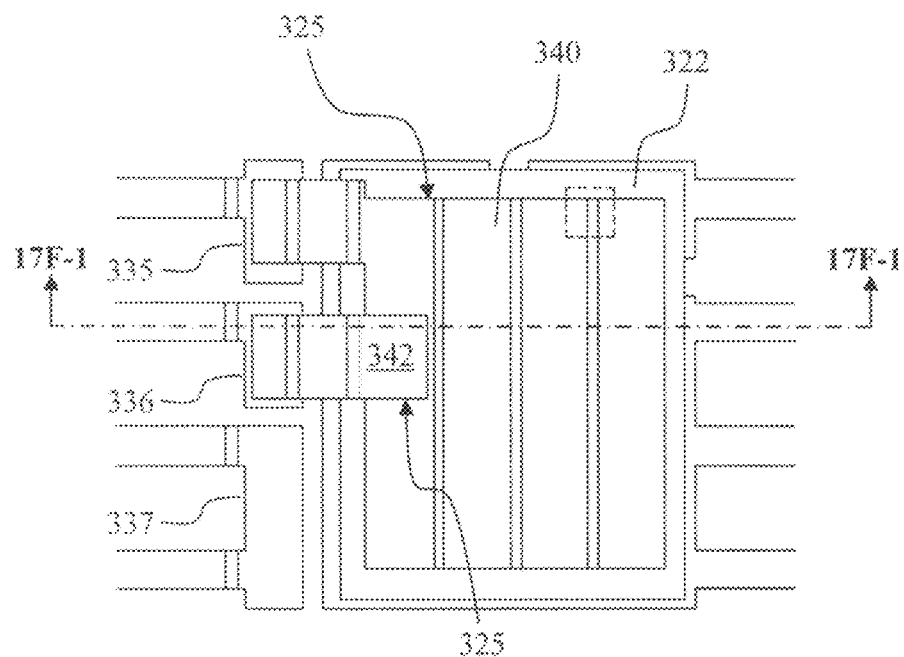
Figures 1, 17F:

Referring to FIGS. 17D-17F, conductive adhesive 308 may be placed on the first semiconductor die 322 and on lead segment 335 of the base lead frame 320. A first segment 340 of a first clip structure 325 is attached on the first semiconductor die 322. One end of the first segment 340 is also attached to a lead segment 335 of the base lead frame. A second segment 342 of the first clip structure 325 is non-conductively attached on the first segment 340, e.g. with non-conductive epoxy; the second segment 342 is also connected to a lead segment 336 of the base lead frame at another end. Optionally, a non-conductive projection (not shown) may be used to help ensure the proper spacing and non-conduction between first segment 340 and second segment 342. The first segment 340 may include a zig-zag shaped structure as shown in the cross sectional FIG. 17E-1, taken along cross section line 17E-1. The zig-zag shape has elasticity and reduced fixed contact area to provide stress release from stresses developed at the die/clip interface. The zig-zag structure also allows for outgassing from the conductive adhesive which can reduce void formation and improve electrical performance and reliability. The zig-zag pattern may include a series of lowered bottom surfaces 340a at which the clip first segment 340 attaches to the first semiconductor die 322. The top of first segment 340 should include a recessed portion 340b to which the second segment 342 can attach. This allows the top of second segment 342 and the upper portions of first segment 340 to be co-planar, as seen in the cross section of FIG. 17F-1, taken along line 17F-1 of FIG. 17F. The recessed portion 340b may be formed, e.g., by stamping, bending, or etching. FIGS. 17E-2 and 17E-3 show alternative shapes for first clip structure first segments 340' and 340". Due to the recessed portion 340b, the top of second segment 342 may be coplanar with the top of first segment 340.

Figure 17G:
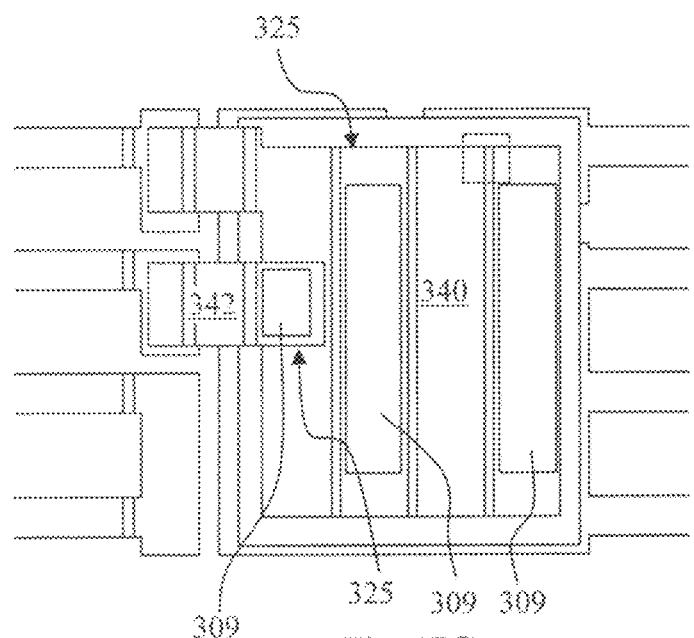
Figure 17H:
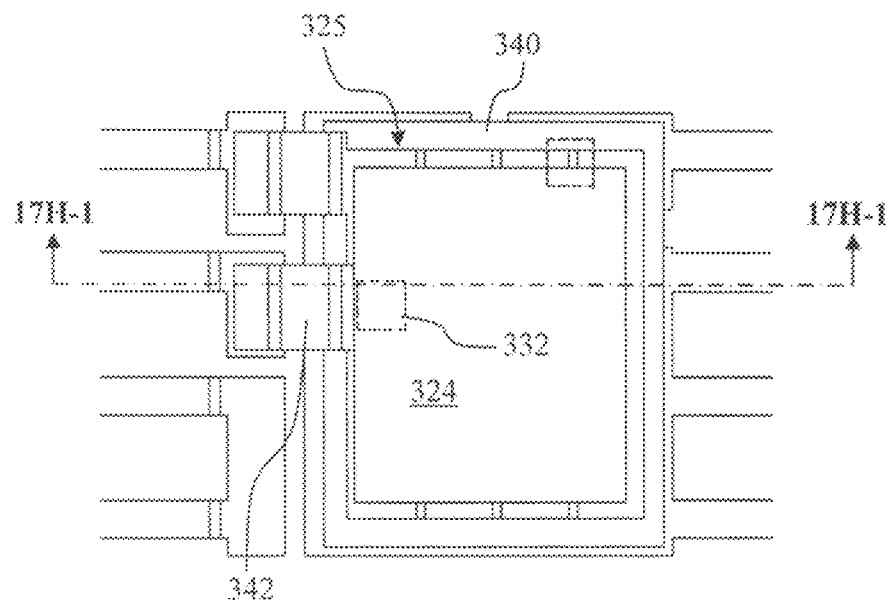
Figures 1, 17H:
Figure 17I:
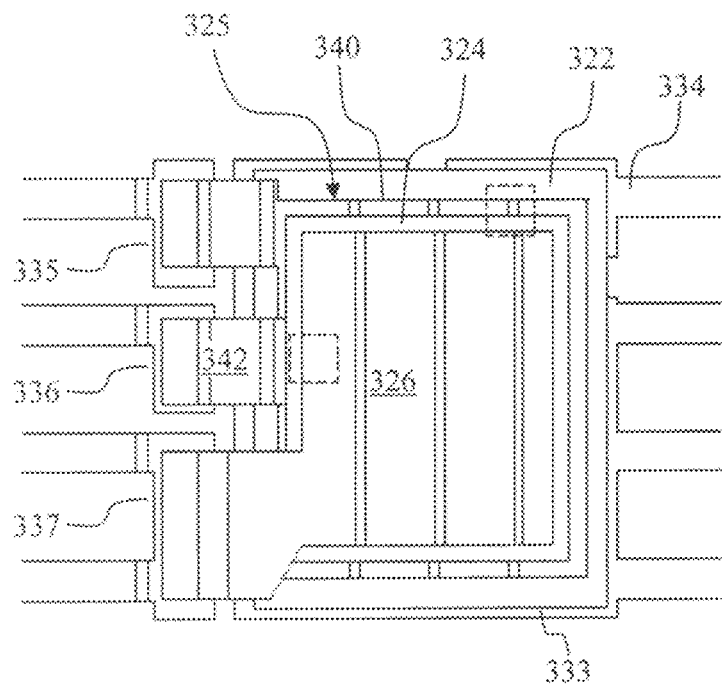
Figures 1, 171:
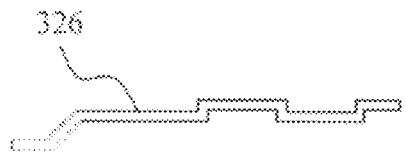
Figures 2, 171:
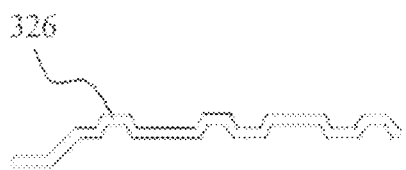
Figures 3, 171:
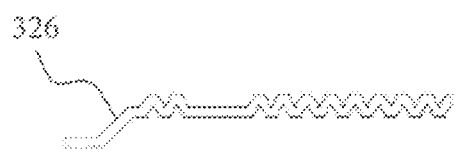

Next conductive adhesive 309 can be deposited on top of first segment 340 and second segment 342 of first clip structure 325 as shown in FIG. 17G, and the second semiconductor die 324 can be flip chip mounted over the first and second segments 340 and 342 of the first clip structure 325 as shown in FIG. 17H. The location of the gate contact 332 of the second semiconductor die 324, though facing down, is indicated by dashed lines and contacts the second segment 342 of the first clip structure 325. The source of second semiconductor die 324 also faces down and contacts the first segment 340 of first clip structure 325. FIG. 17H-1 is a cross section taken along line 17H-1 of FIG. 17H. As can be seen, the lower portions of segment 340 contact the first semiconductor die 322, and the higher portions of segment 340 contact the second semiconductor die 324. The second segment 342 is non-conductively attached to a recessed portion of first segment 340. The tops of first and second segments 340 and 342 can thus be coplanar to allow for stacking the second semiconductor the 324 atop thereof, while also allowing for connection to be made from the second semiconductor die gate contact 332. A second clip structure 326 may be mounted over the second semiconductor die 324 and also connected to a lead segment 337. FIGS. 17I-1 through 17I-3 are side views of some possible shapes of the second clip structure 326. By way of example the first semiconductor die 322 may be a low side FET 80 (of FIG. 10A) and second semiconductor die 324 may be a high side FET 90.

In one embodiment, the first segment 340 may be bent or stamped into shape to form the recessed region to which the second segment 342 can attach. In an alternative embodiment, as shown in FIGS. 18A through 18C, the first segment 440 of first clip structure 425 may have a half etched portion 440a to form the recessed portion for the second segment 442 to attach to. In the side view of first segment 440 in FIG. 18B, the location of the recessed portion 440a is indicated by dashed lines. In the side view of the second segment 442 shown in FIG. 18C, the outline of the first segment 440 is shown in dashed lines. The first segment 440 can also have the zig-zag structure formed by a half-etch process, forming thinned portions 440b interspersed along the bottom of the first segment 440.

In another alternative embodiment, as shown in FIGS. 19A to 19C, a portion 540a of the first segment 540 may be entirely removed such that the second segment 542 may be located there—the second segment 542 may then be non-conductively attached to first semiconductor die 322, similarly to FIG. 4.

It should be understood that the foregoing description is merely an example of the invention and that modifications and may be made thereto without departing from the spirit and scope of the invention and should not be construed as limiting the scope of the invention. The scope of the invention, therefore, should be determined with respect to the appended claims, including the full scope of equivalents thereof.

The invention claimed is:
1. A semiconductor package comprising:
a first semiconductor die;
a clip structure attached to the first semiconductor die; and
a plurality of leveling projections located between the clip structure and the first semiconductor die, such that the clip structure is parallel with the semiconductor die, wherein an adhesive material is located between at least some of the leveling projections, attaching the clip structure to the first semiconductor die, at least some of said adhesive material being electrically conductive and located between at least some of the leveling projections, electrically connecting at least a portion of the clip structure to the first semiconductor die, with the clip structure further comprising a first conductive segment and a second conductive segment, the first conductive segment being conductively attached to the first semi- conductor die, and the second conductive segment being in superimposition with and electrically isolated from the first semiconductor die.

2. The package of claim 1 wherein said leveling projections have a common height.

3. The package of claim 1 wherein said clip structure is in electrical communication with a package lead.

4. The package of claim 1 wherein the clip structure further comprises a first conductive segment and a second conductive segment.

5. The package of claim 4 wherein the tops of the first and second conductive segments are co-planar.

6. The package of claim 1 further comprising a second semiconductor chip stacked on the clip structure on a side opposite that of the first semiconductor die.

7. A semiconductor package comprising:
a first semiconductor die;
a clip structure, having first and second conductive segments, attached to the first semiconductor die; and
a plurality of electrically non-conductive leveling projections located between the clip structure and the first semiconductor die, such that the clip structure is parallel with the semiconductor die, wherein an adhesive material is located between at least some of the leveling projections, attaching the clip structure to the first semiconductor die, with the first conductive segment being conductively attached to the first semiconductor die, and the second conductive segment being superimposed with but electrically isolated from the first semiconductor die.

8. The package of claim 7 wherein said leveling projections have a common height.

9. The package of claim 7 wherein said clip structure is in electrical communication with a package lead.

10. The package of claim 7 wherein a sub-portion of said adhesive material is electrically conductive and located between at least some of the leveling projections, electrically connecting at least a portion of the clip structure to the first semiconductor die.

11. The package of claim 7 wherein the tops of the first and second conductive segments are co-planar.

12. The package of claim 7 further comprising a second semiconductor chip stacked on the clip structure on a side opposite that of the first semiconductor die.

13. A semiconductor package comprising:
a first semiconductor die;
a clip structure, having first and second conductive segments, attached to the first semiconductor die;
a plurality of electrically non-conductive leveling projections located between the clip structure and the first semiconductor die, such that the clip structure is parallel with the semiconductor die, wherein an adhesive material is located between at least some of the leveling projections, attaching the clip structure to the first semiconductor die, with the first conductive segment being electrically conductively attached to the first semiconductor die, and the second conductive segment is superimposed with and electrically isolated from the first semiconductor die; and
a second semiconductor chip stacked on the clip structure on a side opposite that of the first semiconductor die.

14. The package of claim 13 wherein said leveling projections have a common height.

15. The package of claim 13 wherein said clip structure is in electrical communication with a package lead.

16. The package of claim 13 wherein a sub-portion of said adhesive material is electrically conductive and located between at least some of the leveling projections, electrically connecting at least a portion of the clip structure to the first semiconductor die.

* * * * *